United States Patent [19]

Haukness et al.

[11] Patent Number: 5,790,467

[45] Date of Patent: Aug. 4, 1998

[54] APPARATUS AND METHOD FOR A DIRECT-SENSE SENSE AMPLIFIER WITH A SINGLE READ/WRITE CONTROL LINE

[75] Inventors: Brent S. Haukness, Garland; Hugh McAdams, McKinney, both of Tex.

[73] Assignee: Texas Instruments Incorporated, Dallas, Tex.

[21] Appl. No.: 756,094

[22] Filed: Nov. 25, 1996

[51] Int. Cl.$^6$ .................................................. G11C 7/00
[52] U.S. Cl. ........................................ 365/205; 365/230.08
[58] Field of Search .............................. 365/205, 230.08; 327/57

[56] References Cited

U.S. PATENT DOCUMENTS

| | | | |
|---|---|---|---|
| 5,034,636 | 7/1991 | Reis et al. | 365/49 |
| 5,274,598 | 12/1993 | Fujii et al. | 365/205 |
| 5,293,338 | 3/1994 | Ihara | 365/205 |
| 5,568,073 | 10/1996 | McClure | 327/51 |
| 5,568,434 | 10/1996 | Jeon | 365/201 |
| 5,585,747 | 12/1996 | Proebsting | 365/189.11 |
| 5,604,697 | 2/1997 | Takahashi et al. | 365/182 |

Primary Examiner—David C. Nelms
Assistant Examiner—Michael T. Tran
Attorney, Agent, or Firm—Robert N. Rountree; J. Fred Telecky; Richard L. Donaldson

[57] ABSTRACT

In a dynamic random access memory, the sense amplifiers associated with the storage cells have the direct sense circuitry (MNEW, MNWE_, MNRD, MNRD_) included therewith to minimize the effects of parasitic impedance. In addition, the Y-select circuits (MNYS, MNYS_) are combined with the read/write enable circuits (MNWE, MNWE_, MNRD, MNRD_) to eliminate a transistor pair, thereby reducing the required layout area. By locating the Y-select (MNYS, MNYS_) circuits between the sense amplifier MNWE, MNWE_, MNRD, MNRD_) and the local input/output lines (LIO, LIO_), the WRITE-ENABLE and the READ-ENABLE signals can be combined in a single signal.

18 Claims, 3 Drawing Sheets

APPARATUS AND METHOD FOR A DIRECT-SENSE SENSE AMPLIFIER WITH A SINGLE READ/WRITE CONTROL LINE

This invention relates generally to semiconductor devices and, more particularly, to dynamic random access memory (DRAM) units. A dynamic random access memory unit includes sense amplifiers which detect and establish the logic state of represented by the charge on stored on a memory unit storage element.

DESCRIPTION OF THE RELATED ART

The sense amplifier units associated with the storage capacitors of the DRAM units sense or detect the quantity of the charge on a storage capacitor and apply an output sense amplifier signal dependent on the charge state. Direct sensing of the stored charge has been proposed for future generations of DRAM units because of advantages in speed and because the timing constraints of the proposed units is less critical. A typical direct sensing configuration requires an additional six transistors between the Y-select transistors of the sense amplifier and the input/output (I/O) lines of DRAM unit. For performance reasons, these transistors should be located as close to the sense amplifier as possible. In the ideal situation, these transistors should be located in the sense amplifier itself. The location of these transistors in the sense amplifier itself results in an increase in the layout area required by the sense amplifier circuit.

Referring to FIG. 1, a direct sense amplifier configuration, according to the prior art, is shown. A BL signal is applied to a first source-drain terminal of n-channel field effect transistor MNBL1, while a BL_ signal is applied to a first source-drain terminal of n-channel field effect transistor MNBL1_. A T1 signal is applied to a gate terminal of transistor MNBL1 and to a gate terminal of transistor MNBL1_. A second source-drain terminal of transistor MNBL1 is coupled to a first source-drain terminal of n-channel field effect transistor MNEQ1, to a first source-drain terminal of n-channel field effect transistor MNEQ3, to a first gate terminal of p-channel field effect transistor MPC1, to a first source-drain terminal of p-channel transistor MPC1_, to a first signal terminal of n-channel MNC1_, to a gate terminal of n-channel field effect transistor MNC1, and to a first signal terminal of n-channel field effect transistor MNYS. A second source-drain terminal of transistor MNB1_ is coupled to a first source-drain terminal of n-channel field effect transistor MNEQ2, to a second source-drain terminal of n-channel field effect transistor MNEQ3, to a gate terminal of transistor MPC1_, to a first source-drain terminal of transistor MPC1, to a first source-drain terminal of transistor MNC1, to a gate terminal of transistor MNC1_, and to a first source-drain terminal of n-channel field effect transistor MNYS_. An BLR signal is coupled to a second source-drain terminal of transistor MNEQ1 and to a second source-drain terminal of transistor MNEQ2. An EQ signal is applied to a gate terminal of transistor MNEQ1, to a gate terminal of transistor MNEQ2, and to a gate terminal of transistor MNEQ3. A PC signal is applied to a second source-drain terminal of transistor MPC1 and to a second ssource-drain terminal of transistor MPC1_. A VARY potential is applied to the substrates of transistors MPC1 and MPC1_. An NC signal is applied to a second source-drain terminal of MNC1 and a second source-drain terminal of MNC1_. A YS (Y-SELECT) signal is applied to a gate terminal of transistor MNYS and to a gate terminal of transistor MNYS_. A second source-drain terminal of transistor MNYS is coupled to a first terminal of a first local input/output line RES_LIO, while a second source-drain terminal of transistor MNYS_ is coupled to a first terminal of a second local I/O line RES_LIO_. A second terminal of local I/O line RES_LIO is coupled to a gate terminal of n-channel field effect transistor MNRD and to a first source-drain terminal of n-channel field effect transistor MNWE. A second terminal of local I/O line RES_LIO_ is coupled to a gate terminal of n-channel field effect transistor MNRD_ and to a first source-drain terminal of n-channel field effect transistor MNWE_. A first source-drain terminal of transistor MNRD and a first source-drain terminal of transistor MNRD_ are coupled to ground potential. A second source-drain terminal of transistor MNRD is coupled to a first source-drain terminal of n-channel field effect transistor MNRE, while a second source-drain terminal of transistor MNRD_ is coupled to a first source-drain terminal of n-channel field effect transistor MNRE_. A RE (READ-ENABLE) signal is applied to the gate terminals of transistors MNRE and MNRE_. A WE (WRITE_ENABLE) signal is applied to gate terminals of transistors MNWE and MNWE_. A second source-drain terminal of transistor MNWE and a second source-drain terminal of transistor MNRE are coupled to a first I/O terminal. A second source-drain terminal of transistor MNWE_ and a second source-drain terminal of transistor MNRE_ are coupled to a second I/O terminal.

Referring to FIG. 2, a time delay for a read-write operation as a function of parasitic impedances is shown. Removing or minimizing this time delay is one of the objects of the present invention.

Referring to FIG. 3, a sense amplifier, including a conventional direct sense circuitry, is shown. A BL signal is coupled to a first source-drain terminal of n-channel field effect transistor MNBL, while a BL_ signal is applied to a first source-drain n-channel field effect transistor MNBL_. A T1 signal is applied to applied to a gate terminal of transistor MNBL and to a gate terminal of transistor MNBL_. A second source-drain terminal of transistor MNBL is coupled to a first source-drain terminal of n-channel field effect transistor MNEQ1, to a first source-drain terminal of n-channel field effect transistor MNEQ3, to a gate terminal of p-channel field effect transistor MPC1, to a first source-drain terminal of n-channel field effect transistor MPC1_, to a first source-drain terminal of n-channel field effect transistor MNC1_, to a gate terminal of n-channel field effect transistor MNC1, and to a first source-drain terminal of n-channel field effect transistor MNYS. A second source-drain terminal of transistor MNBL_ is coupled to a first source-drain terminal of n-channel field effect transistor MNEQ2, to a second source-drain terminal of transistor MNEQ3, to a gate terminal of transistor MPC1_, to a first source-drain terminal of transistor MPC1, to a first source-drain terminal of transistor MNC1, to a gate terminal of transistor MNC1_, and to a first source-drain terminal of n-channel field effect transistor MNYS_. A BLR signal is applied to a second source-drain terminal of transistor MNEQ1 and to a second source-drain terminal of transistor MNEQ2. An EQ signal is applied to a gate terminal of transistor MNEQ1, to a gate terminal of transistor MNEQ2, and to a gate-terminal of transistor MNEQ3. A PC signal is applied to a second source-drain terminal of transistor MPC1_ and to a second source-drain terminal of transistor MPC1_. A VARY potential is applied to the substrates of transistor MPC1 and transistor MNPC2_. An NC signal is coupled to a second source-drain terminal of transistor MNC1, to a first source-drain terminal of n-channel field effect transistor MNRD, to a second source-drain terminal of transistor MNC1__, and to a first source-drain terminal of n-channel field effect transistor MNRD__. A gate terminal of transistor MNRD is coupled to a second source-drain of transistor MNYS and to a second source-drain terminal of n-channel field effect transistor MNWE, while a gate terminal of transistor MNRD__ is coupled to a second source-drain terminal of transistor MNYS__ and to a first source-drain terminal of n-channel field effect transistor MNWE__. A second source-drain terminal of transistor MNRD is coupled to a first source-drain terminal of n-channel field effect transistor MNRE. A second source-drain terminal of transistor MNRD__ is coupled to a first source-drain terminal of n-channel field effect transistor MNRE__. A second source-drain terminal of transistor MNRE is coupled to a second source-drain terminal of transistor MNWE and to the local input/output line RES__LIO, while a second source-drain terminal of transistor MNRE__ is coupled to a second source-drain terminal of transistor MNWE__ and to a local output line RES__LIO__. An RE signal is coupled to the gate terminal of transistor MNRE and to the gate terminal of transistor MNRE__. A WE signal is coupled to a gate terminal of transistor MNWE and to a gate terminal of transistor MNWE__.

In the direct sensing implementation shown in FIG. 1, the output signals from the sense amplifier are coupled to the gates of read transistors MNRD/MNRD__ through the local I/O lines. In the read operation, the RE (READ-ENABLE) signal is high and the WE (WRITE-ENABLE) signal is low, thereby connecting the read transistors to the I/O lines through the MNRE/MNRE__ transistor pair. Similarly, in a write operation, the WE signal is high and the RE signal is low, thereby connecting the I/O lines directly to the local I/O lines through the MNWE/MNWE__ transistor pair and therefore to the selected sense amplifier through the MNYS/MNYS__ transistor pair. Using this implementation, a plurality of sense amplifiers can be connected to one set of direct-sense transistors as long as only one YS (Y-SELECT) signal is high for the sense amplifier. A principal disadvantage of this approach is that the output data delay is highly dependent on the parasitic impedances of the local I/O lines (RES__LIO/RES__LIO__) as shown in FIG. 2. It is desirable to provide local I/O lines that are as short as possible.

Referring to FIG. 3, the sensing delay associated with the parasitic impedances is minimized by placing the direct-sense circuitry within the sense amplifier itself. The direct-sense circuitry has six related transistors, MNRD/MNRD__, MNRE/MNRE__, and MNWE/MNWE__ in addition to the typical sense amplifier configuration. The RE (READ-ENABLE) and WE (WRITE-ENABLE) signals are global to the entire sense amplifier bank, while the YS (Y-SELECT) signal is high only for the accessed sense amplifier. In the read operation, the RE signal is high, the WE signal is low, and the YS signal is for the selected sense amplifier. This combination of signals causes the nodes N1 and N2, associated with the second terminals of the MNBL/MNBL__ transistor, pair to be coupled to the gate terminals of the MNRD/MNRD__ read transistor pair through the MNYS/MNYS__ transistor pair. The MNRD/MNRD__ read transistor pair are coupled to the local I/Os (RES__LIO/RES__LIO__) through the MNRE/MNRE_transistor pair as a result of the high RE signal. In a write operation, the RE signal is low, the WE signal is high, and the YS signal is once again high for the selected sense amplifier. This combination of signals couples the RES__LIO/RES__LIO__the sense nodes N1 and N2 (i.e. second terminals of the MNBL/MNBL__ transistor pair) through the MNWE/MNWE__ transistor pair and the MNYS/MNYS__ transistor pair, thereby bypassing the MNRD/MNRD__ transistor pair. The wave forms of FIG. 4 illustrate this operation for a read-write cycle. The parasitic impedances between the sense nodes and the direct-sense transistors are minimized with this approach. However, the layout area (i.e., of the sense amplifier is greatly increased.

A need has therefore been felt for apparatus and a method for reducing the layout area of the sense amplifier when the direct-sense circuitry is included therewith. In addition, the reduction of the number of control signals to the sense amplifier is desirable.

SUMMARY OF THE INVENTION

The aforementioned and other features are accomplished, according to the present invention, by incorporating the direct sense circuitry with the sense amplifier to reduce the effects of parasitic impedances, by combining the operation of the Y-select transistors with the read/write transistors to reduce the number of transistors, and by positioning the Y-select transistors between the sense amplifier and the local input/output lines to reduce the control signals required in the read/write operation. The control signals are reduced by combining the WE (WRITE-ENABLE) signal with the RE (READ-ENABLE) signal.

These and other features of the present invention will be understood upon the reading of the Specification in conjunction with the Figures.

DESCRIPTION OF THE PREFERRED EMBODIMENT(S)

1. Detailed Description of the Drawings FIG. 1, FIG. 2, FIG. 3, and FIG. 4 have been described with respect to the prior art.

Figure 5:
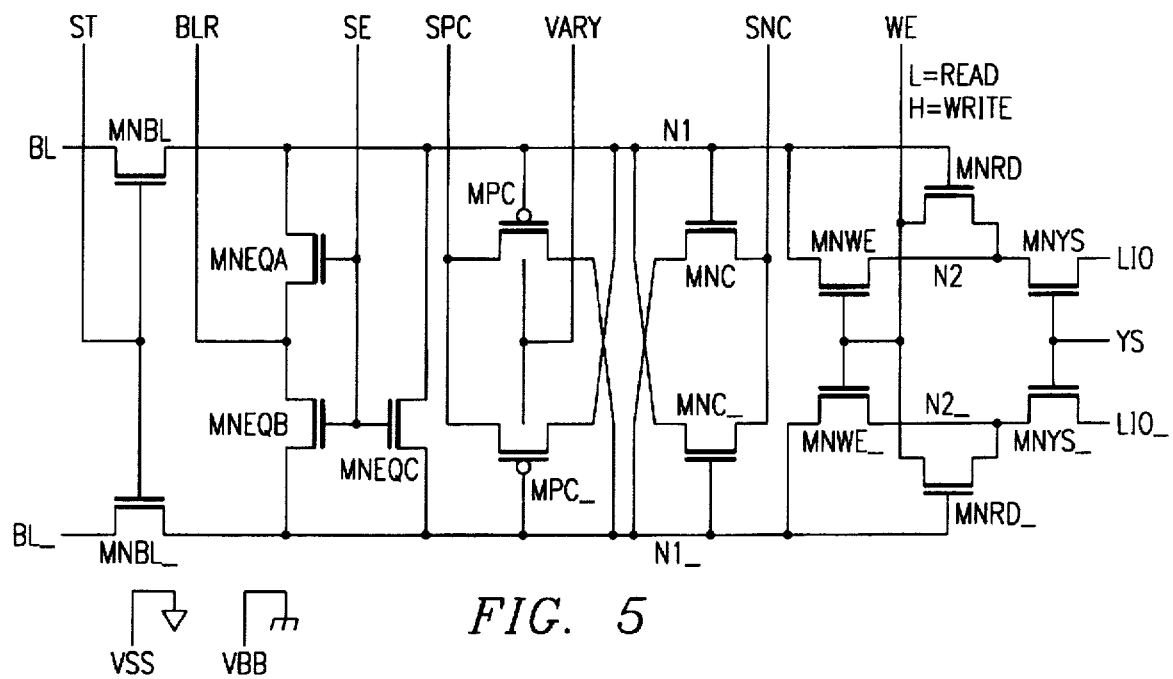
FIG. 5 is a schematic circuit diagram of a sense amplifier which includes the associated direct sense circuitry according to the present invention.

Referring next to FIG. 5, a schematic circuit diagram according to the present invention is shown. The BL signal is applied to a first source-drain terminal of n-channel field effect transistor MNBL, while a BL__ signal is applied to a first source-drain terminal of field effect transistor MNBL__. A ST signal is applied to a gate terminal of transistor MNBL and to a gate terminal of transistor MNBL__. A second source-drain terminal of transistor MNBL, also node N1, is coupled to a first source-drain terminal of n-channel field effect transistor MNEQA, to a first terminal source-drain terminal of field effect transistor MNEQC, to a gate terminal of p-channel field effect transistor MPC, to a first source-drain terminal of p-channel field effect transistor MPC_, to a first source-drain terminal of n-channel field effect transistor MNC_, to a gate terminal of n-channel field effect transistor MNC, to a first source-drain terminal of n-channel field effect transistor MNWE, and to a gate terminal of n-channel field effect transistor MNRD. A second source-drain terminal of transistor MNBL_ is coupled to a first source-drain terminal of n-channel field effect transistor MNEQB, to a second source-drain terminal of transistor MNEQC, to a gate terminal of transistor MPC_, to a first source-drain terminal of transistor MPC, to a first source-drain terminal of transistor MNC, to a gate terminal of transistor MNC_, to a first source-drain terminal of n-channel field effect transistor MNWE_, and to a gate terminal of n-channel field effect transistor MNRD_. A BLR signal is coupled to a second source-drain terminal of transistor MNEQA and to a second source-drain terminal of transistor MNEQB. A SE signal is coupled to a gate terminal of transistor MNEQA, to a gate terminal of transistor MNEQB, and to a gate terminal of transistor MNEQC. The SNC signal is applied to a second source-drain terminal of transistor MNC and to a second source-drain terminal of transistor MNC_. A WE signal is applied to a first source-drain terminal of transistor MNRD, to a second source-drain terminal of transistor MNRD_, to a gate terminal of transistor MNWE, and to a gate terminal of transistor MNWE_. A second source-drain terminal of transistor MNRD (node N2) is coupled to a second source-drain terminal of transistor MNWE and to a first source-drain terminal of n-channel field effect transistor MNYS. A second source-drain terminal of transistor MNRD_ (node N2_) is coupled to a second source-drain terminal of transistor MNWE_ and to a first source-drain terminal of n-channel field effect transistor MNYS_. A second source-drain terminal of transistor MNYS is coupled to the local input output line LIO, while a second source-drain terminal of transistor MNYS_ is coupled to the local input/output line LIO_. A YS signal is applied to the gate terminal of transistor MNYS and to a gate terminal of transistor MNYS_.

Figure 6:
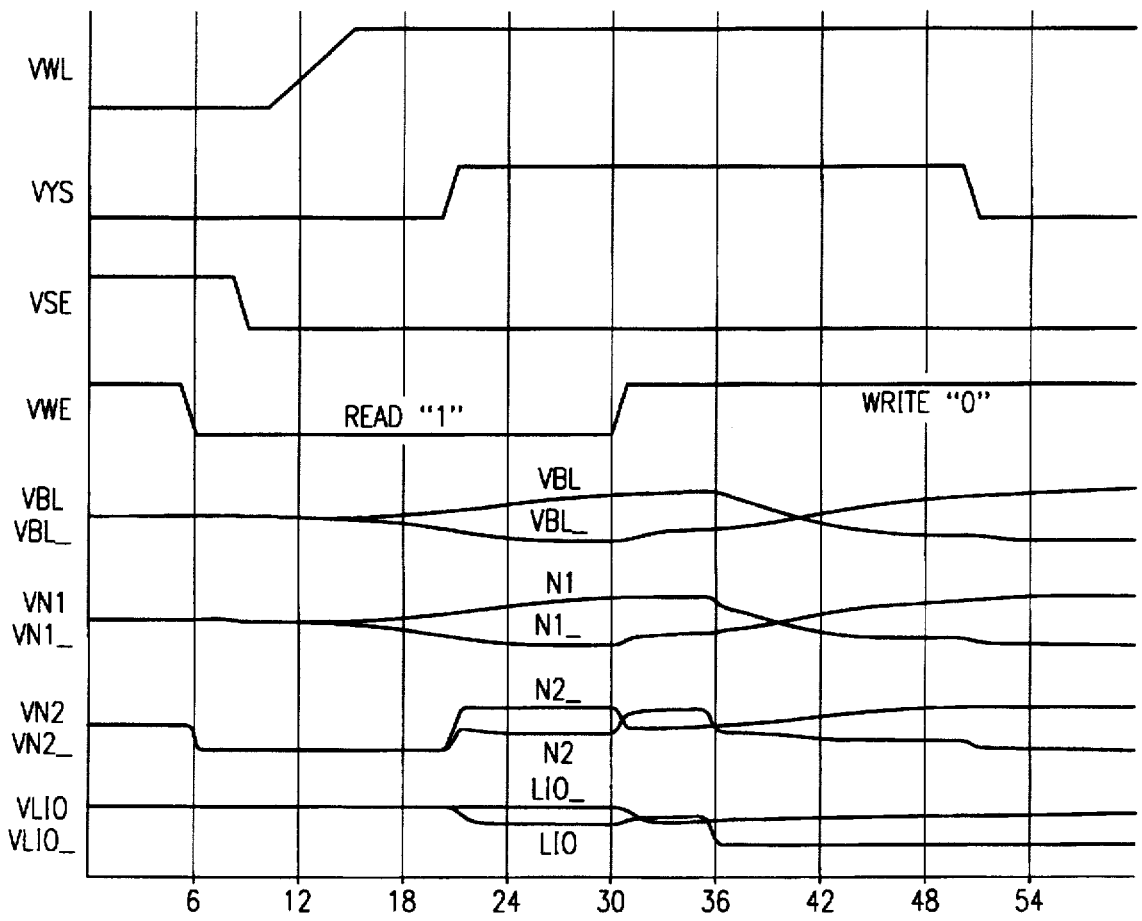
FIG. 6 is a series of graphs showing the simulated time dependence of selected signals for the sense amplifier of FIG. 5.

Referring to FIG. 6, the voltage levels for selected signals of the present invention, derived from a simulation program, are shown as a function of time for both the READ and the WRITE cycle.

2. Operation of the Preferred Embodiment(s)

Referring once again to FIG. 5, the direct-sense circuitry associated with the sense amplifier of the present invention has only four transistors in addition to the typical sense amplifier configuration of the prior art. The read transistors MNRD/MNRD_ and the write-back transistors MNWE/MNWE_ provide the same function as in the conventional direct-sense amplifier. The configuration of the present invention eliminates the read-enable transistors MNRE/MNRE_ by moving the other direct sense amplifiers to the sense amplifier side of the Y-select transistors. The Y-select amplifiers then function to isolate the unselected sense amplifiers from the local input/output lines. Only a single read/write line is needed to control both the read and the write operation.

In a read cycle, the WE signal is driven low. As a result, the source terminal of read amplifiers MNRD/MNRD_ is coupled to the VSS potential. As soon as the column address is decoded, the YS signal for the selected sense amplifier is driven to a high state, thereby coupling the local input/output lines to the read transistors. The sense nodes of the selected sense amplifier therefore control the current in the local input/output lines LIO and LIO_ through transistors MNRD and MNRD_. In the write cycle, the WE signal ia driven high state. This high state results in the coupling of nodes N2 and N2_ directly to the sense nodes through transistors MNWE and MNWE_. The local input/output lines LIO and LIO_ for the selected sense amplifier are connected to the sense nodes and can overwrite the latched data of the sense amplifiers. With the WE signal driven high, the read transistors MNRD and MNRD_ are non-conducting because the source of these transistors is in a high state and the gate is directly connected to the drain.

Figure 1:
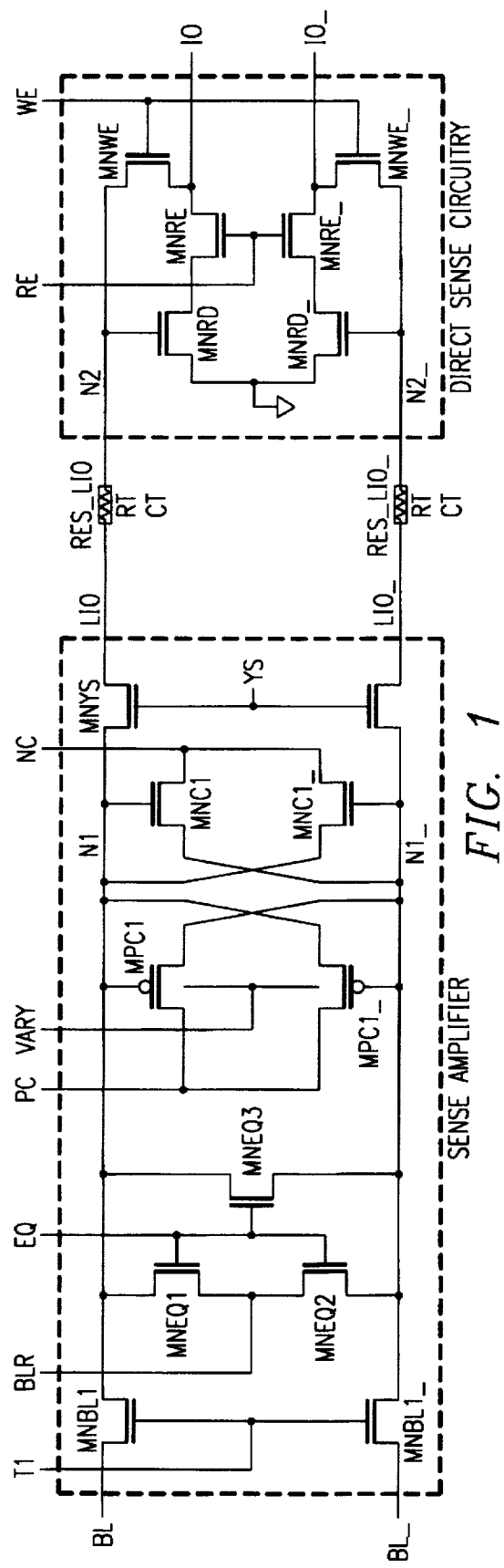
FIG. 1 is a schematic circuit diagram of a sense amplifier with an associated direct sense circuitry separated by the local I/O lines according to the prior art.
Figure 3:
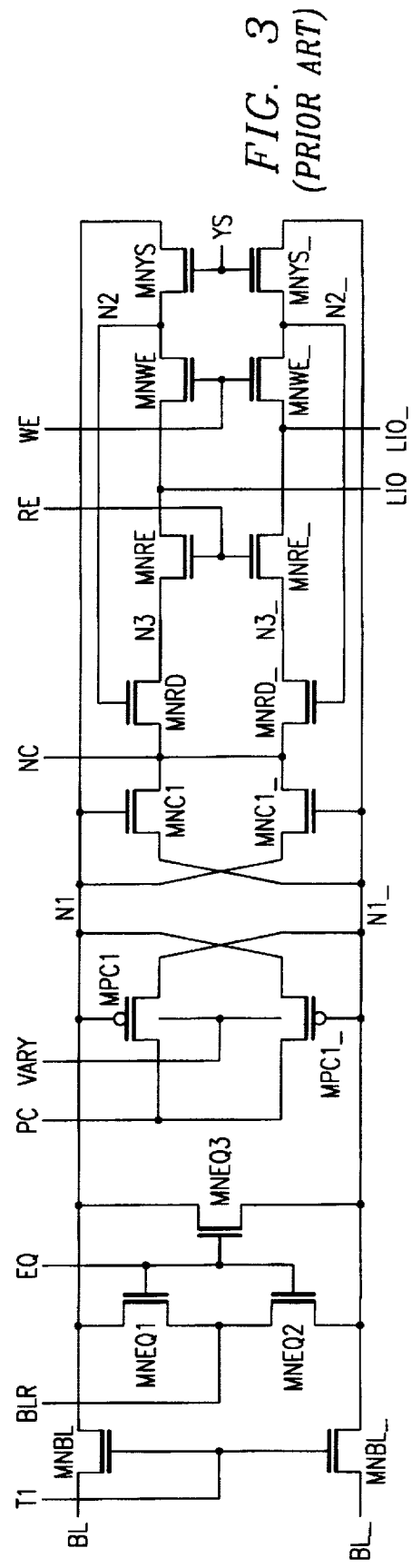
FIG. 3 is a schematic circuit diagram of a sense amplifier which includes the associated direct sense circuitry according to the prior art.
Figure 2:
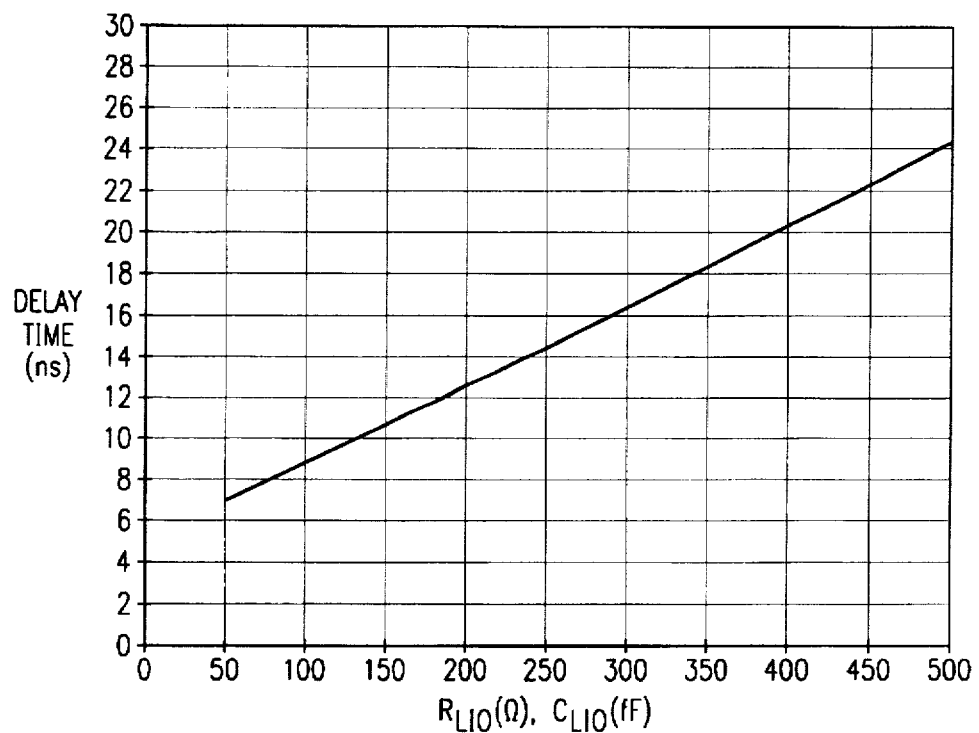
FIG. 2 is a graph of the simulated operational delay time as a function of the parasitic impedance for the sense amplifier of FIG. 1.
Figure 4:
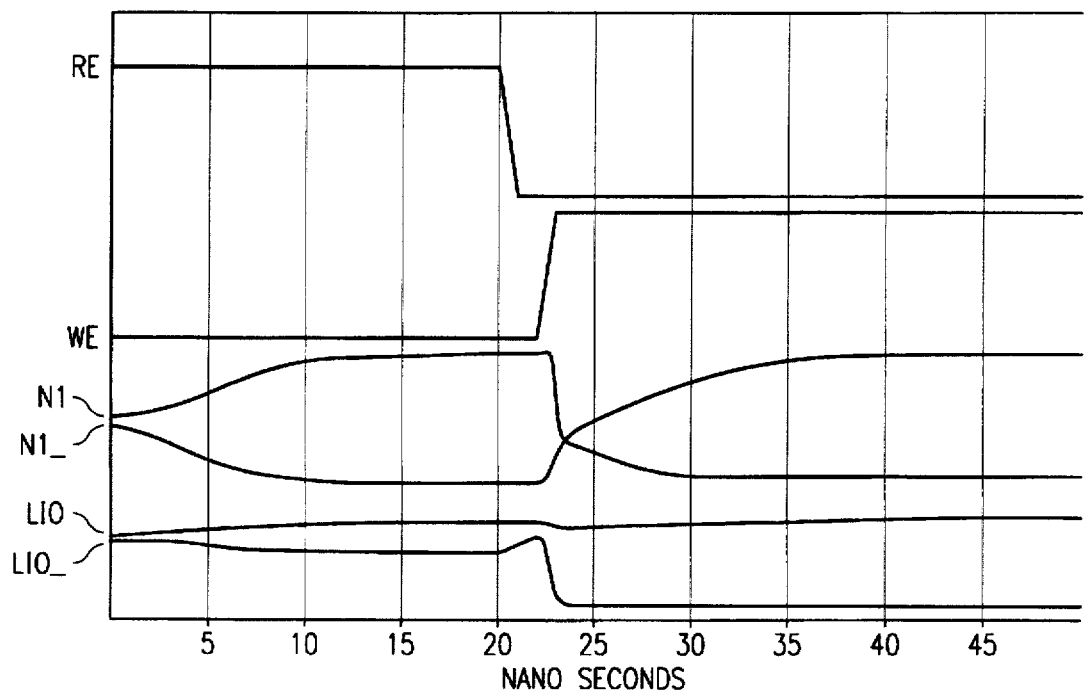
FIG. 4 is a series of graphs showing the simulated time dependence of the signals for the sense amplifier unit of FIG. 3.

Referring to FIG. 6, a comparison between FIG. 6 and FIG. 4 illustrates that the present implementation of the direct-sensing circuitry with the sense amplifier retains the feature of minimizing the effect of local I/O parasitic impedances. Moreover, the present configuration is implemented with a reduced number of transistors, thereby reducing the layout area required for the sense amplifier. The combining of the Y-select circuit with the read-enable and the write-enable circuits eliminates the need for one pair of transistors, thereby reducing the area on the substrate required by the amplifier. The READ-ENABLE signal and the WRITE-ENABLE signal can be combined when the Y-select circuitry is positioned to isolate the remainder of the sense amplifier from the input/output lines.

While the invention has been described with particular reference to the preferred embodiment, it will be understood by those skilled in the art that various changes may be made and equivalents substituted for elements of the preferred embodiment without departing from the invention. In addition, many modifications may be made to adapt a particular situation and material to a teaching of the present invention without departing from the essential teachings of the present invention.

As is evident from the foregoing discussion, certain aspects of the invention are not limited to the particular details of the examples illustrated, and it is therefore contemplated that other modifications and applications will occur to those skilled in the art. It is accordingly intended that the claims shall cover all modifications and applications as do not depart from the spirit and scope of the invention.

What is claimed is:

1. A sense amplifier circuit for a memory device, comprising:

a first transistor having a control gate and a current path, the control gate coupled to a first bit line of the memory device, the current path coupled between a control terminal and a first data terminal;

a second transistor having a control gate and a current path, the control gate coupled to a second bit line of the memory device, the current path coupled between the control terminal and a second data terminal;

a third transistor having a control gate and a current path, the control gate coupled to the control terminal, the current path coupled between the first bit line and one of the first or second data terminals; and a fourth transistor having a control gate and a current path, the control gate coupled to the control terminal, the current path coupled between the second bit line and the other of the first or second data terminals.

2. A sense amplifier circuit as in claim 1, further comprising:

a fifth transistor having a control gate and a current path, the control gate coupled to receive an address signal, the current path coupled between the first data terminal and a first data line; and a sixth transistor having a control gate and a current path, the control gate coupled to receive the address signal, the current path coupled between the second data terminal and a second data line.

3. A sense amplifier circuit as in claim 2, wherein the first bit line is a complement of the second bit line and the first data line is a complement of the second data line.

4. A sense amplifier circuit as in claim 2, wherein the control terminal is coupled to receive a first logic state of a write enable signal for applying a datum at one of the first or second bit lines to one of the first or second data lines and wherein the control terminal is coupled to receive a second logic state of the write enable signal for applying a datum at one of the first or second data lines to one of the first or second bit lines.

5. A sense amplifier circuit as in claim 4, wherein each of the first, second, third and fourth transistors are N-channel transistors.

6. A sense amplifier circuit as in claim 4, wherein the address signal is a column address signal.

7. A sense amplifier circuit as in claim 6, further comprising:

a seventh transistor having a control gate and a current path, the control gate coupled to the first bit line, the current path coupled between the second bit line and a voltage supply terminal;

an eighth transistor having a control gate and a current path, the control gate coupled to the second bit line, the current path coupled between the first bit line and the voltage supply terminal;

an ninth transistor having a control gate and a current path, the control gate coupled to the first bit line, the current path coupled between the second bit line and a reference supply terminal; and a tenth transistor having a control gate and a current path, the control gate coupled to the second bit line, the current path coupled between the first bit line and the reference supply terminal.

8. A sense amplifier circuit as in claim 7, wherein the seventh and eighth transistors are P-channel transistors and the ninth and tenth transistors are N-channel transistors.

9. A dynamic random access memory device, comprising:

an array of storage cells arranged in rows and columns, each column including a bit line pair coupled to a plurality of storage cells;

an address and control circuit, responsive to external signals, for generating an address signal and a control signal;

an input/output buffer circuit for receiving data signals and supplying data signals;

a data line pair coupled to the input/output buffer circuit; and a direct sense amplifier circuit having an address terminal coupled to receive the address signal and a control terminal coupled to receive the control signal, the direct sense amplifier selectively connected between the bit line pair and the data line pair in response to the address signal, the direct sense amplifier applying data from the bit line pair to the data line pair in response to a first logic state of the control signal, the direct sense amplifier applying data from the data line pair to the bit line pair in response to a second logic state of the control signal.

10. A memory device as in claim 9, wherein the direct sense amplifier further comprises:

a first transistor having a control gate and a current path, the control gate coupled to a first bit line of the bit line pair, the current path coupled between the control terminal and a first data line of the data line pair;

a second transistor having a control gate and a current path, the control gate coupled to a second bit line of the bit line pair, the current path coupled between the control terminal and a second data line of the data line pair;

a third transistor having a control gate and a current path, the control gate coupled to the control terminal, the current path coupled between the first bit line and one of the first or second data lines; and a fourth transistor having a control gate and a current path, the control gate coupled to the control terminal, the current path coupled between the second bit line and the other of the first or second data lines.

11. A memory device as in claim 10, further comprising:

a fifth transistor having a control gate and a current path, the control gate coupled to the address terminal, the current path coupled between the first transistor and the first data line; and a sixth transistor having a control gate and a current path, the control gate coupled to the address terminal, the current path coupled between the second transistor and the second data line.

12. A memory device as in claim 11, wherein the control signal is a read and write control signal.

13. A memory device as in claim 12, wherein the address signal is a column address signal.

14. A memory device as in claim 13, wherein the direct sense amplifier further comprises:

a seventh transistor having a control gate and a current path, the control gate coupled to the first bit line, the current path coupled between the second bit line and a voltage supply terminal;

an eighth transistor having a control gate and a current path, the control gate coupled to the second bit line, the current path coupled between the first bit line and the voltage supply terminal;

an ninth transistor having a control gate and a current path, the control gate coupled to the first bit line, the current path coupled between the second bit line and a reference supply terminal; and a tenth transistor having a control gate and a current path, the control gate coupled to the second bit line, the current path coupled between the first bit line and the reference supply terminal.

15. A memory device as in claim 14, wherein the seventh and eighth transistors are P-channel transistors and the ninth and tenth transistors are N-channel transistors.

16. A method of writing and reading data in a memory device including the steps of:

applying a datum to a data line;

applying a first logic state of a control signal to a control terminal of a first transistor and to a current path of a second transistor for turning on the first transistor and turning off the second transistor;

applying the datum at the data line to a memory cell via the first transistor;

storing the datum in the memory cell;

applying a second logic state of the control signal to the control terminal of a first transistor and to a current path of a second transistor for turning off the first transistor and turning on the second transistor; and applying the datum in the memory cell to the data line via the second transistor.

17. A method of writing and reading data as in claim 16, further including the steps of:

applying an address signal to a select transistor; and coupling the data line to the memory cell via the select transistor in response to the address signal.

18. A method of writing and reading data as in claim 17, further including the step of amplifying the datum in the memory cell during the second logic state of the control signal.

* * * * *